(12) United States Patent
Sirinorakul et al.

(10) Patent No.: US 9,564,387 B2
(45) Date of Patent: Feb. 7, 2017

(54) SEMICONDUCTOR PACKAGE HAVING ROUTING TRACES THEREIN

(71) Applicant: UTAC Headquarters Pte. Ltd., Singapore (SG)

(72) Inventors: Saravuth Sirinorakul, Bangkok (TH); Antonio Bambalan Dimaano, Jr., Singapore (SG); Rui Huang, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days.

(21) Appl. No.: 14/794,715

(22) Filed: Jul. 8, 2015

(65) Prior Publication Data
US 2016/0064310 A1    Mar. 3, 2016

Related U.S. Application Data

(60) Provisional application No. 62/043,276, filed on Aug. 28, 2014.

(51) Int. Cl.
| | |
|---|---|
| *H01L 23/495* | (2006.01) |
| *H01L 21/48* | (2006.01) |
| *H01L 23/31* | (2006.01) |
| *H01L 21/66* | (2006.01) |
| *H01L 21/56* | (2006.01) |
| *H01L 23/00* | (2006.01) |

(52) U.S. Cl.
CPC ..... *H01L 23/49541* (2013.01); *H01L 21/4825* (2013.01); *H01L 21/4828* (2013.01); *H01L 21/565* (2013.01); *H01L 22/14* (2013.01); *H01L 23/3114* (2013.01); *H01L 23/4952* (2013.01); *H01L 23/49503* (2013.01); *H01L 24/32* (2013.01); *H01L 2224/32245* (2013.01); *H01L 2224/48091* (2013.01); *H01L 2224/48247* (2013.01); *H01L 2224/48249* (2013.01); *H01L 2224/73265* (2013.01); *H01L 2224/83385* (2013.01); *H01L 2924/181* (2013.01)

(58) Field of Classification Search
CPC ............... H01L 23/49541; H01L 24/32; H01L 21/4825; H01L 22/14; H01L 21/4828; H01L 23/4952; H01L 23/49503; H01L 21/565; H01L 23/3114; H01L 2224/83385; H01L 2224/48249; H01L 2224/32245; H01L 2224/4824
See application file for complete search history.

(56) References Cited

U.S. PATENT DOCUMENTS 5,428,248 A * 6/1995 Cha .................... H01L 23/4951
                                                    257/676
5,939,779 A * 8/1999 Kim .................... H01L 21/565
                                                    257/673

(Continued)

*Primary Examiner* — Michelle Mandala
(74) *Attorney, Agent, or Firm* — Haverstock & Owens LLP

(57) ABSTRACT

A method of and device for making a semiconductor package. The method comprises etching a first side of a metallic piece forming a leadframe with one or more wire bonding pads, applying a first protective layer on the first side, etching a second side of the metallic piece forming one or more conductive terminals, and applying a second protective layer on the second side. The semiconductor package comprises wire bonding pads in pillars structure surrounding a die attached to the leadframe. One or more terminals are on the bottom side of the semiconductor package.

19 Claims, 11 Drawing Sheets

(56) References Cited

U.S. PATENT DOCUMENTS

| | | |
|---|---|---|
| 6,784,547 B2 | 8/2004 | Pepe |
| 7,364,941 B2 | 4/2008 | Usui et al. |
| 7,473,586 B1 | 1/2009 | Lo et al. |
| 2008/0258276 A1* | 10/2008 | Low ........................ H01L 24/97 257/676 |
| 2010/0276792 A1 | 11/2010 | Chi et al. |
| 2012/0126384 A1 | 5/2012 | Meng |

* cited by examiner

SEMICONDUCTOR PACKAGE HAVING ROUTING TRACES THEREIN

CROSS-REFERENCE TO RELATED APPLICATION(S)

This application claims priority under 35 U.S.C. §119(e) of the U.S. Provisional Patent Application Ser. No. 62/043,276, filed Aug. 28, 2014 and titled, "A Semiconductor Package Having Routing Traces Therein," which is also hereby incorporated by reference in its entirety for all purposes.

FIELD OF THE INVENTION

The present invention relates to the field of semiconductor. More specifically, the present invention relates to a semiconductor package and its manufacturing methods.

BACKGROUND OF THE INVENTION

Conventional QFN (Quad Flat No-Lead) package contains traces that are exposed from the bottom of the package. The traces are vulnerable to contamination as well as mechanical damage. The contamination can cause an electrical short circuit between adjacent leads. The mechanical damages can cause open circuit. Further, the thickness of the conventional QFN package should be reduced to meet the needs of modern electronic devices.

SUMMARY OF THE INVENTION

A semiconductor package is disclosed which includes internal routing traces therein and a method of making the same. The features/advances of the semiconductor packages and the method of making them include reducing thickness of the electronic devices, having routable traces in a lead frame, and providing a protection layer to the traces.

Using the semiconductor package construction or the method of making it disclosed herein, the size of the electronic products incorporating such packages (such as a cell phone, PDA, and laptop) is minimized. In some embodiments, the semiconductor package comprises a lead frame, which replaces a typical laminate substrate that has a plurality of metallic routing layers. In some embodiments, the lead frame includes routing traces between the point of the electric connection to the IC chip and the point of the electric connection to external components, such as a mother board. In some embodiments, the semiconductor package provides a protection layer to the traces, which prevents the contamination of the traces from the environment.

In a aspect, a method of making a semiconductor package comprises etching a first side of a metallic piece to form a leadframe with one or more wire bonding pads, applying a first protective layer on the first side, etching a second side of the metallic piece to form one or more conductive terminals, and applying a second protective layer on the second side.

In some embodiments, the one or more wire bonding pads comprise a pillar structure. In other embodiments, the one or more wire bonding pads are in a position higher than a position of a die attached to the leadframe. In some other embodiments, the one or more wire bonding pads form a cavity allowing a die to fit within the cavity. In some embodiments, the one or more conductive terminals are beneath a die attached to the leadframe. In other embodiments, none of the one or more conductive terminals are beneath a die attached to the leadframe. In some other embodiments, the leadframe comprises an electric conductive path from the one or more wire bonding pads to the one or more conductive terminals. In some embodiments, the method further comprises a conductive trace between the one or more wire bonding pads and the one or more conductive terminals. In other embodiments, the method further comprises coupling a die to the leadframe. In some other embodiments, the method further comprises filling a cavity beneath a die attached to the leadframe. In some embodiments, the method further comprises plating on the one or more wire bonding pads.

In another aspect, a semiconductor package comprises a first pillar structure on the first end of a leadframe, a second pillar structure on the second end of the lead frame, a cavity between the first and the second pillars, and a die physically coupling with the leadframe within the cavity. In some embodiments, the pillars are taller than the die. In other embodiments, a first molding material encapsulating a side wall of the first pillar, a side wall the second pillars, and the die. In some other embodiments, the first pillar couples with a first wire bonding pad. In some embodiments, the leadframe couples with a second wire bonding pad.

In another aspect, a method of forming a semiconductor package comprises etching a metallic piece forming a shaped leadframe, applying a mask with a predetermined thickness on the leadframe to a first predetermined area on the shaped leadframe, such that one or more apertures with a predetermined depth are formed, and depositing a conductive material to the aperture.

In some embodiments, the conductive material forms a pillar structure. In other embodiments, the pillar structure has a height close to the thickness of the mask. In some other embodiments, the depositing comprises plating.

In another aspect, a method of testing a semiconductor package comprising electrically coupling a first semiconductor package with a second semiconductor package, wherein the second semiconductor package comprises a protective layer encapsulating the entire second semiconductor package except at least two contacting points on one side and one or more contacting points on the opposite side and sending an electrical signal from the second semiconductor package to the first semiconductor package. In some other embodiments, the testee semiconductor package comprises a BGA, QFN, or a WLCSP package.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1:
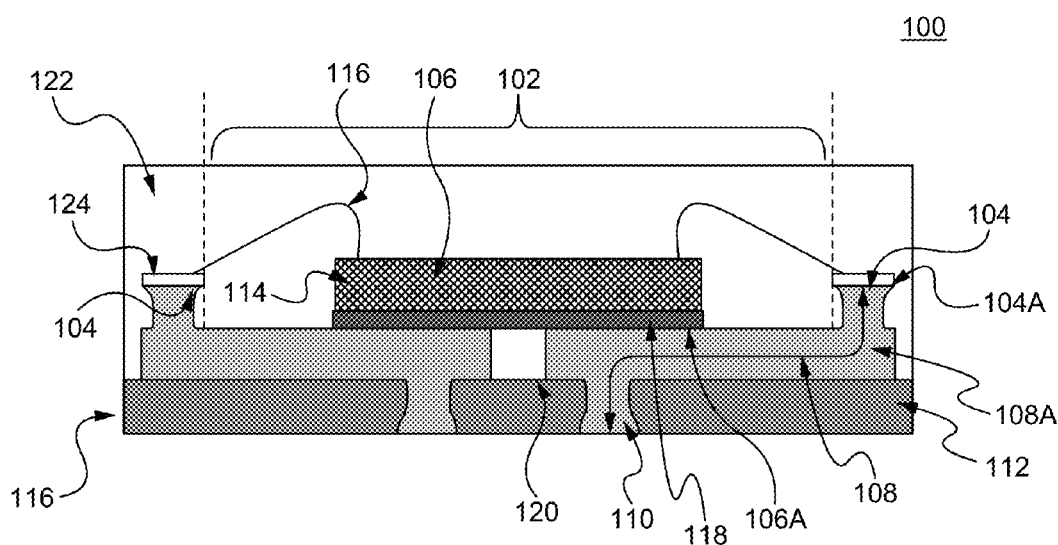
FIG. 1 illustrates a semiconductor package structure 100 in accordance with some embodiments of the present invention.

FIG. 1 illustrates a semiconductor package structure 100 in accordance with some embodiments of the present invention. The structure 100 comprises a cavity 102 formed between wire bond pads 104. A person of ordinary skill in the art appreciates that there can be any number of wire bond pads, according to the requirements of an integrated circuit chip intended to be coupled to the package. In some embodiments, the cavity 102 comprises a space allowing one or more IC chips to be fit therewithin. In some embodiments, a die 106 is placed inside the cavity 102 in a way that a bottom surface 106A of the die 106 is lower than the top surface 104A of the wire bond pads 104. One or more traces 108 each provides an electrical conductive/signal pathway 108A from a wire bond pad 104 to a terminal 110. In some embodiments, the terminal 110 comprises a lateral displacement from the wire bond pad 104, which makes the terminal 110 not directly located beneath the wire bond pads 104. In some embodiments, a plating layer 124 is plated/coated/spread on a wire bonding pad 104, such that a wire 116 is able to couple the plating layer 124 with the IC chip 114.

In some embodiments, a protective layer 112 encloses/covers substantially all or a predetermined portion of the bottom of the package, such that the traces 108/terminals 110 are isolated/insulated/protected from contamination from the environment. In some embodiments, the protective layer 112 is made using a molded underfill (MUF) material through using a molding process.

In some embodiments, an IC 114 having the die 106 is coupled with/attached to the leadframe 116 by a die attaching film (DAF) 118. In some embodiments, a gap 120 is formed between the DAF 118 and the protective layer 112. The gap 120 can be filled by a molding compound 122 using a molding process.

Figure 2:
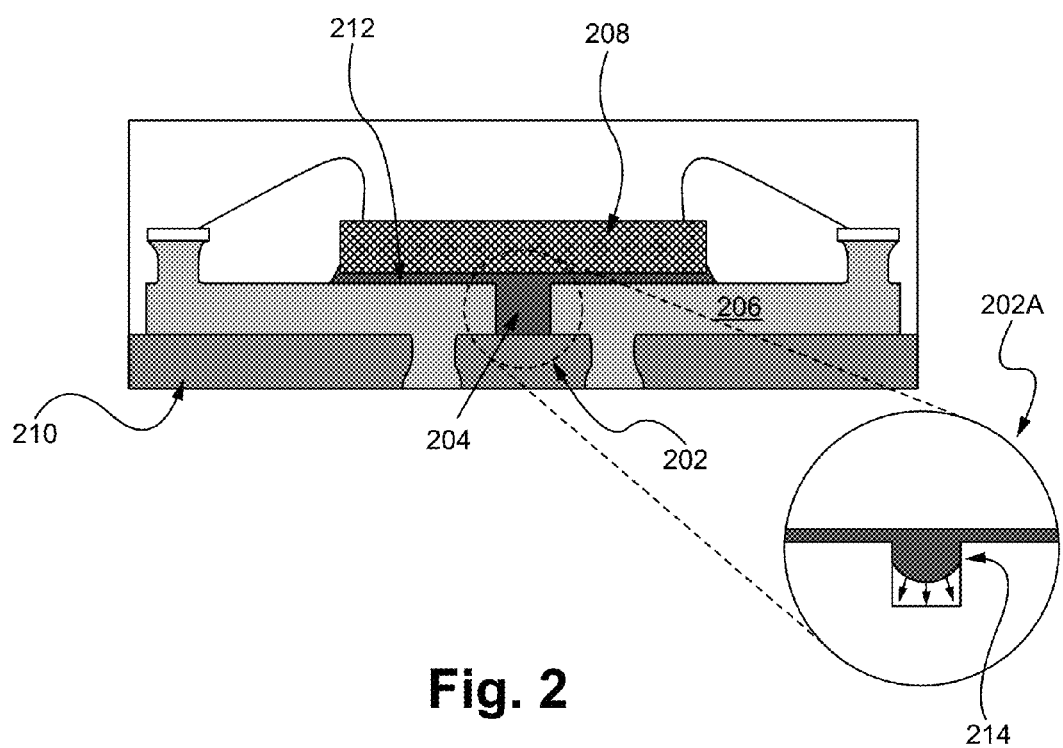
FIG. 2 illustrates another semiconductor package structure 200 in accordance with some embodiments of the present invention.

FIG. 2 illustrates another semiconductor package structure 200 in accordance with some embodiments of the present invention. The semiconductor package structure 200 is similar to the semiconductor package structure 100 of FIG. 1 in most parts. Accordingly, descriptions to similar structures in the package structure 100 are also applicable here. The IC chip 208 is attached to the leadframe 210 and the traces 206 via an adhesive 212, such as epoxy or epoxy based adhesive. The adhesive 212 can be a deformable adhesive. As shown in the view 202A, a portion 214 of the adhesive 212 is flowing to fill the gap 204 forming a completed filled area 202 in a die attaching process. A person of ordinary skill in the art appreciates that the deformation/gap filling process can be triggered/performed by applying a pre-determined temperature or any other methods during or subsequent to the die attaching process.

Figure 3:
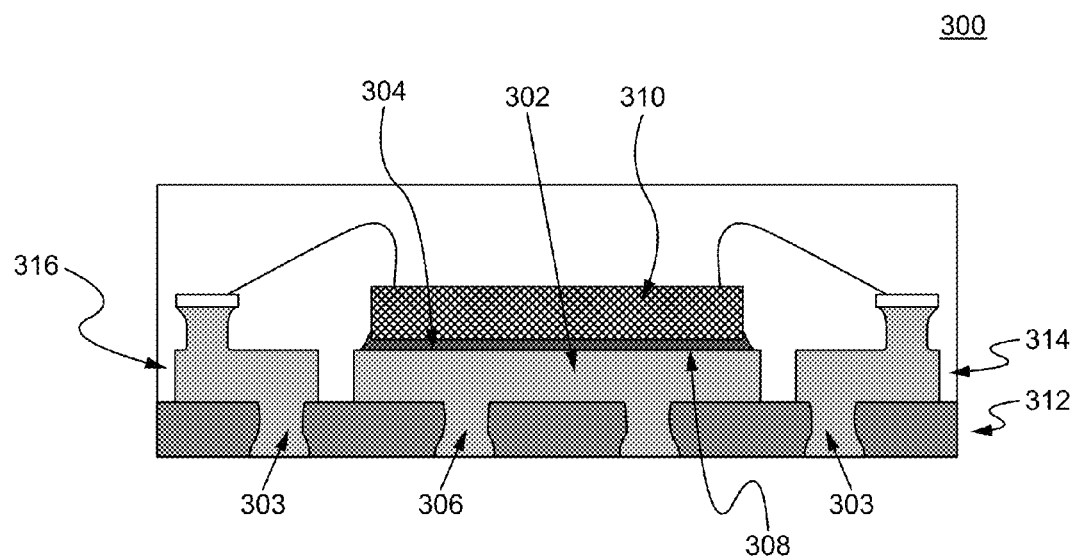
FIG. 3 illustrates another semiconductor package structure 300 in accordance with some embodiments of the present invention.
Figure 4A:
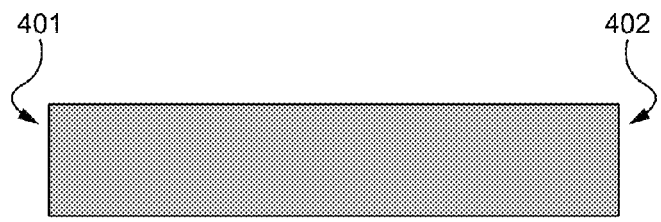
FIGS. 4A-4G illustrate a semiconductor package making method 400 in accordance with some embodiments of the present invention.
Figure 4B:
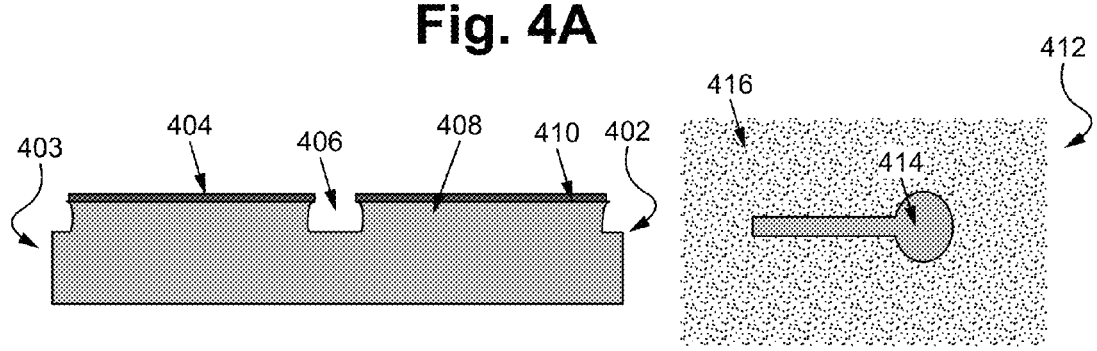
Figure 4C:
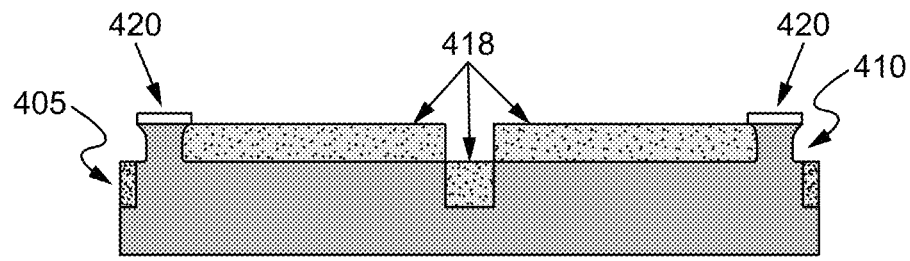
Figure 4D:
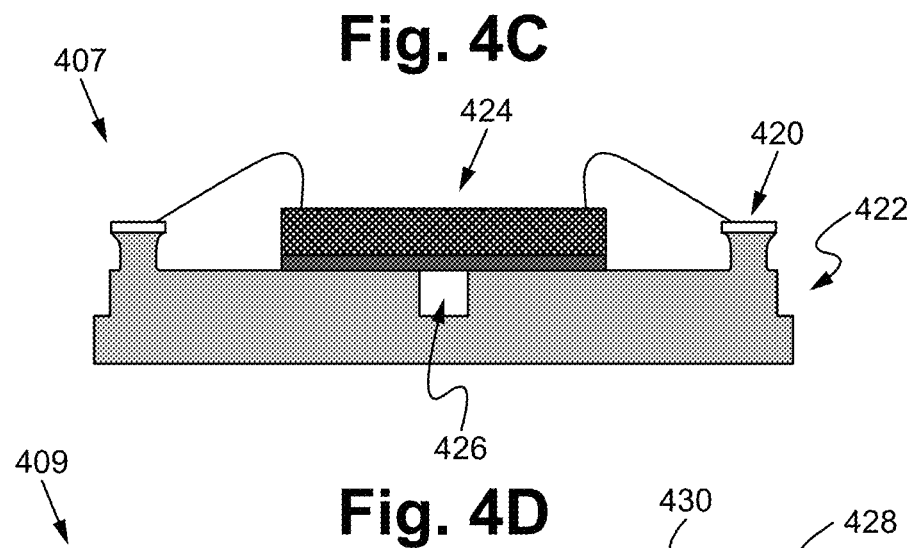
Figure 4E:
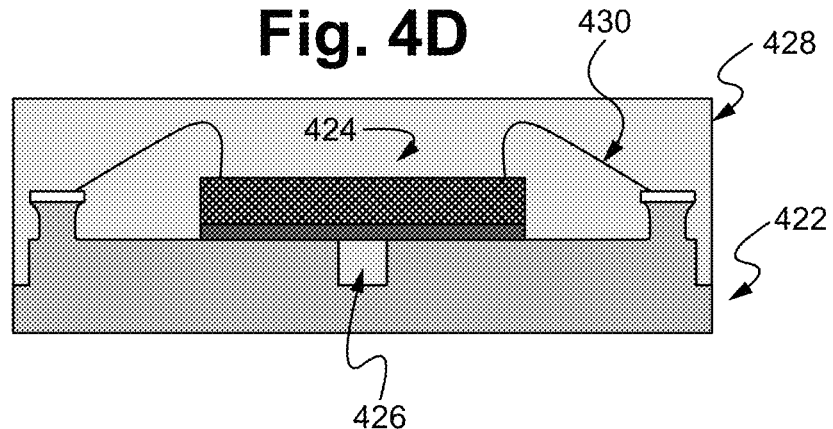
Figure 4F:
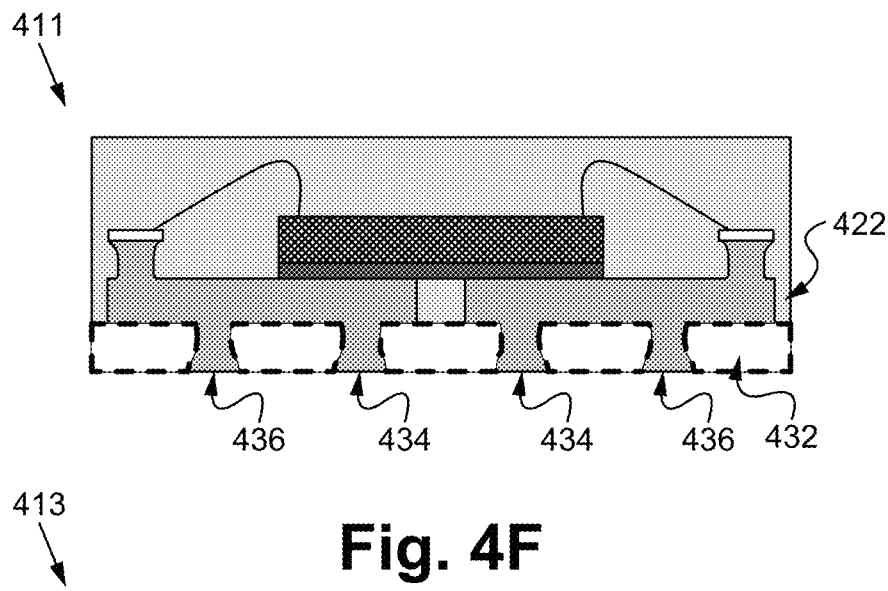
Figure 4G:
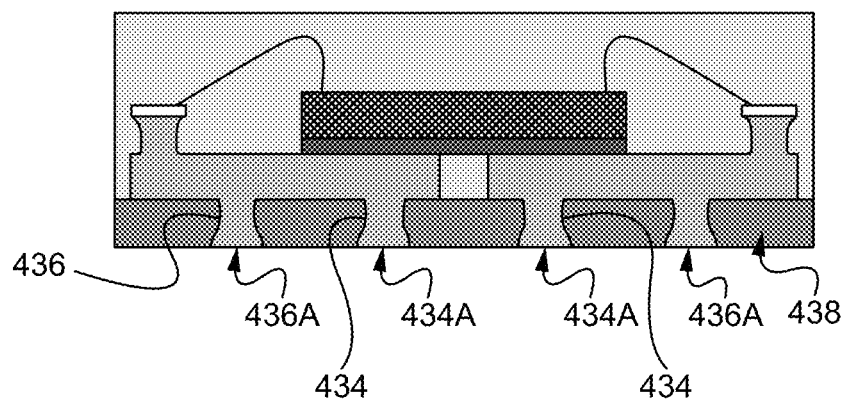

FIG. 3 illustrates another semiconductor package structure 300 in accordance with some embodiments of the present invention. The semiconductor package structure 300 is similar to the semiconductor package structure 100 of FIG. 1 in most parts. Accordingly, descriptions to similar structures in the semiconductor package structure 100 are also applicable here. An IC 310 is attached/coupled to a die attached pad (DAP) 302 on a lead frame 312 via an adhesive 304. One or more terminals 306 are located beneath the DAP. The terminals 306 are used to provide ground signal to the DAP. In some embodiments, the terminals dissipate an amount of heat from the IC chip 310. In some embodiments, the sides of traces 314 are exposed. In some other embodiments, the traces 316 are enclosed/covered and not exposed. In some embodiments, the terminals 303 are below the traces 316.

FIGS. 4A-4G illustrate a semiconductor package making method 400 in accordance with some embodiments of the present invention. At a Step 401 (FIG. 4A), a metallic foil 402 is provided. In some other embodiments, an entire body or a predetermined portion of the metallic foil 402 comprises copper, copper alloy, iron-nickel alloy, or a combination thereof. In some embodiments, the thickness of the metallic foil ranges from 10-300 micron. For example, the thickness of the metallic foil is 150 micron.

At a Step 403 (FIG. 4B), a first mask 404 is placed over a top surface of the foil 402. In some embodiments, the first mask 404 is a mechanical mask. In some other embodiments, the first mask 404 are a photo-sensitive mask. In some other embodiments, the first mask 404 defines the position of the wire bond pads 410 and routing traces 408. The areas that are not covered by the first mask 404 is removed/etched forming a first etched area 406. For example, the view 412 shows an example of a top surface view of a metallic foil. An area 414 that is covered by a mask is the area that is not etched; whereas, the areas that are not covered by the mask form an etched area 416. The etching process can be performed using a chemical etching solution that reacts with the metal, such that the metal is etched.

At a Step 405 (FIG. 4C), a second mask 420 is applied over the top surface of the wire bonding pads 410. In some embodiments, the second mask 420 is a mechanical mask. In some other embodiments, the second mask 420 is a photo-sensitive mask or a hard mask. In some embodiments, a plating layer of wire bonding metallic material is formed on the wire bonding pad as the second mask 420, such that the plating layer also serves as the second mask 420 in a second etching process. In some embodiments, the area exposed and not covered by the second mask 420 is removed/etched, such as the second etched areas 418 are formed. The area that is covered by the second mask 420 is not being removed. As a result of the first etching process in the Step 403 and the second etching process in the Step 405, a first plane, in which the top surfaces of wire bond pads are located, a second plane, in which the top surfaces of the traces are located, and a third plane, in which the bottom surface of the first protective layer is located, are formed. A person of ordinary skill in the art appreciates that the sequences of forming the plating layer and the etching processes can be performed in any suitable orders, including a process performed in the following sequence: (1) forming a plating layer, (2) forming a $1^{st}$ etching mask, (3) performing a $1^{st}$ etching, and (4) performing a $2^{nd}$ etching by using the plating layer as an etching mask.

At a Step 407 (FIG. 4D), an IC chip 424 is attached to a leadframe 422, which was previously manufactured through the Steps 401-405. In some embodiments, a flip chip can be attached to the wire bond pad 420 by solder balls/bumps. In some embodiments, the space 426, beneath the IC chip 422, is completely filled. The flat bottom surface of the leadframe 422 provides a firm support to the bonding sites, which eliminates the bouncing effect during bonding process. In some embodiments, a flip chip is included. The substantial co-planarity of the contact pads is ensured by having an uniform thickness of the leadframe, which minimizes the non-contact failure during a flip chip attachment.

At a Step 409 (FIG. 4E), a mold compound 428 is used to encapsulate the IC 424 and the bonding wires 430. A portion of the leadframe 422 is also covered by the molding compound 428. The molding compound 428 can be any molding material, such as polymers (i.e., polyurethane, polyethylene, polypropylene, and silicones). In some embodiments, the molding process can be performed by using a transfer molding.

At a Step 411 (FIG. 4F), lead frame 422 is etched from the bottom surface. A predetermined portion 432 of the leadframe 422 is etched away to form one or more terminals 434. In some embodiments, a plating layer is disposed at a bottom surface of the leadframe at predetermined locations (such as the locations of the terminals 434) as etching mask, such that the etching occurs at the areas without mask and not at the areas with the mask. After the leadframe 422 is etched from the bottom surface, the bottom surface of the mold compound 428 is exposed from the leadframe 422 and the traces are electrically isolated from each other. In some embodiments where the die attach pad is provided, the traces are electrically isolated from the die attach pad after the etching from the bottom surface of the leadframe. In some embodiments, the terminals 434 are underneath the IC 424. In some other embodiments, the terminals 434 are not underneath the IC 424, such as terminal 436. A person of ordinary skill in the art appreciates that the terminals can be located at any predetermined locations and/or directions. In some embodiments, the terminals 436 provide a stand-off height from the surface on which the package is mounted.

At Step 413 (FIG. 4G), a protective layer 438 is formed at the bottom of the leadframe 422. The protective layer 438 encloses the entire side/substantial all of the entire side of the terminals 434 and 436 while leaving the bottom surfaces 434A and 436A uncovered, such that the terminals 434 and 436 conducts/passes electric signals/electricity. In some embodiments, the bottom surfaces 434A and 436A of the terminals 434 and 436 are covered by another conductive protective layers. In some embodiments, the protective layers are made by a molding process. In some other embodiments, the protective layer comprises a molding underfill (MUF), wherein the filler size of the MUF is smaller than that of the mold compound 428.

Figure 5:
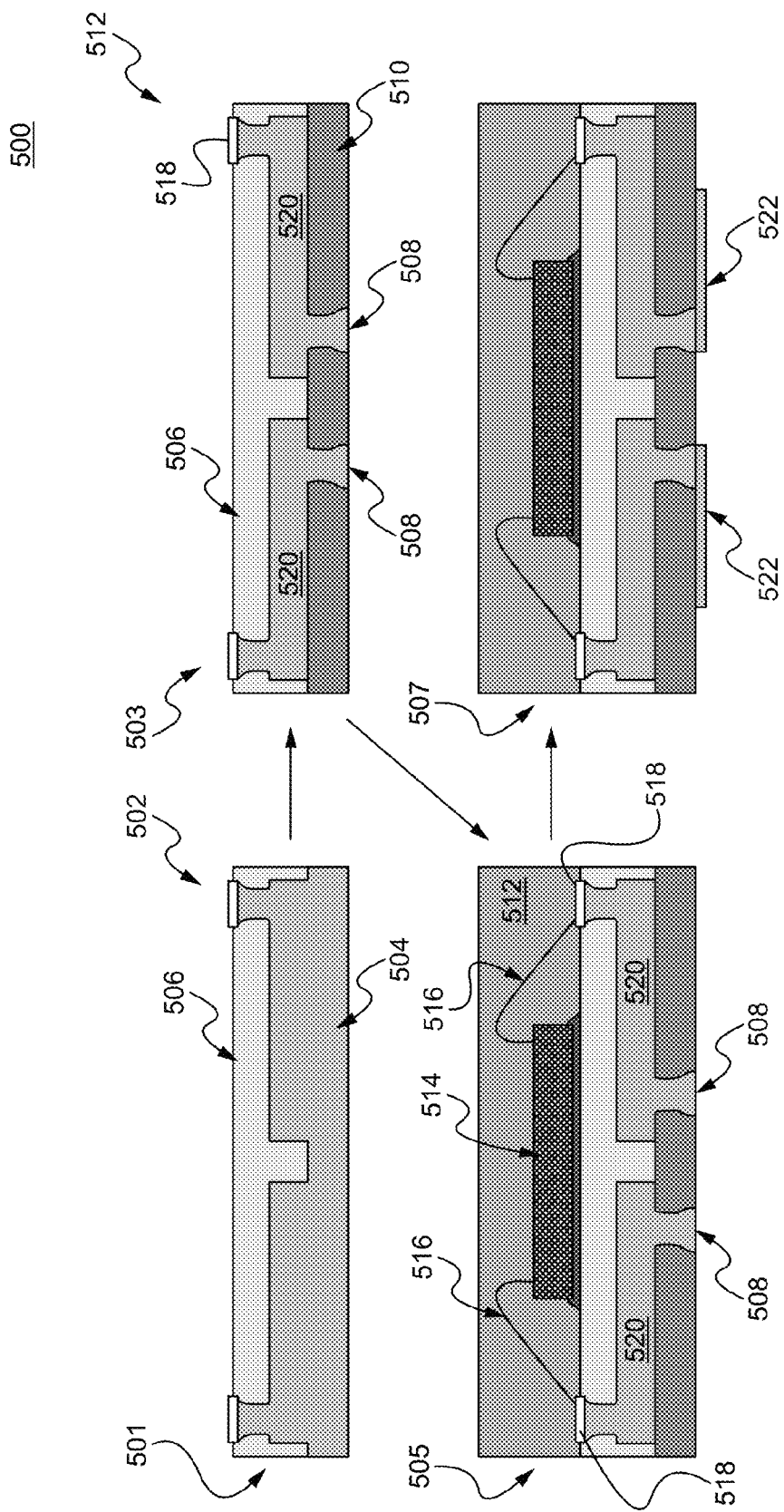
FIG. 5 illustrates a double protective layer structure manufacturing method 500 in accordance with some embodiments of the present invention.

FIG. 5 illustrates a double protective layer structure manufacturing method 500 in accordance with some embodiments of the present invention. At a Step 501, an etched leadframe 504 is formed with a predetermined shaped/contour. The etched leadframe 504 is able to be made by etching a metallic foil as a first etching process, which is a process similar to the Steps 401-405 of the method 400 above. A first protective layer 506 is applied on top of the leadframe 504 prior to a die assemble process, such that a leadframe 502 having a first protective layer 506 on top is formed. At a Step 503, one or more terminals 508 are formed on the bottom side of the leadframe 502 by a second etching process. Once the second etching process is done, a second protective layer 510 is applied to enclose the side of the terminals 508 and covers substantial all or all of the bottom surfaces of the leadframe formed by the second etching process. With the process described above, a double protective layer structure 512 is formed. A person of ordinary skill in the art appreciates that the sequences of forming the first and second protective layers and etching processes can be performed in any orders.

The double protective layer structure 512 comprises a plating layer 518 on the wire bonding pads exposed from the top surface of the first protective layer 506 and the terminals 508 exposed from the bottom surface of the second protective layer 510. The traces 520 are embedded inside the first and second protective layers 506 and 510.

At a Step 505, a die 514 is attached to the top side of the double protective layer structure 512. Wires 516 are bonded to the plating layer 518 on the wire bonding pads forming a conductive/signal path from the die 514, wire bonds 516, wire bond pads 518, traces 520, to the terminals 508. At a Step 507, a routing layer 522 is plated/added onto the terminals 508. It is an optional process to plate/add the routing layer 522 on the terminals 508 during the leadframe fabrication stage and before the die attach process. The benefit is that the leadframe can be fabricated at one location and package assembly processes can be done in a separate location.

Figure 6:
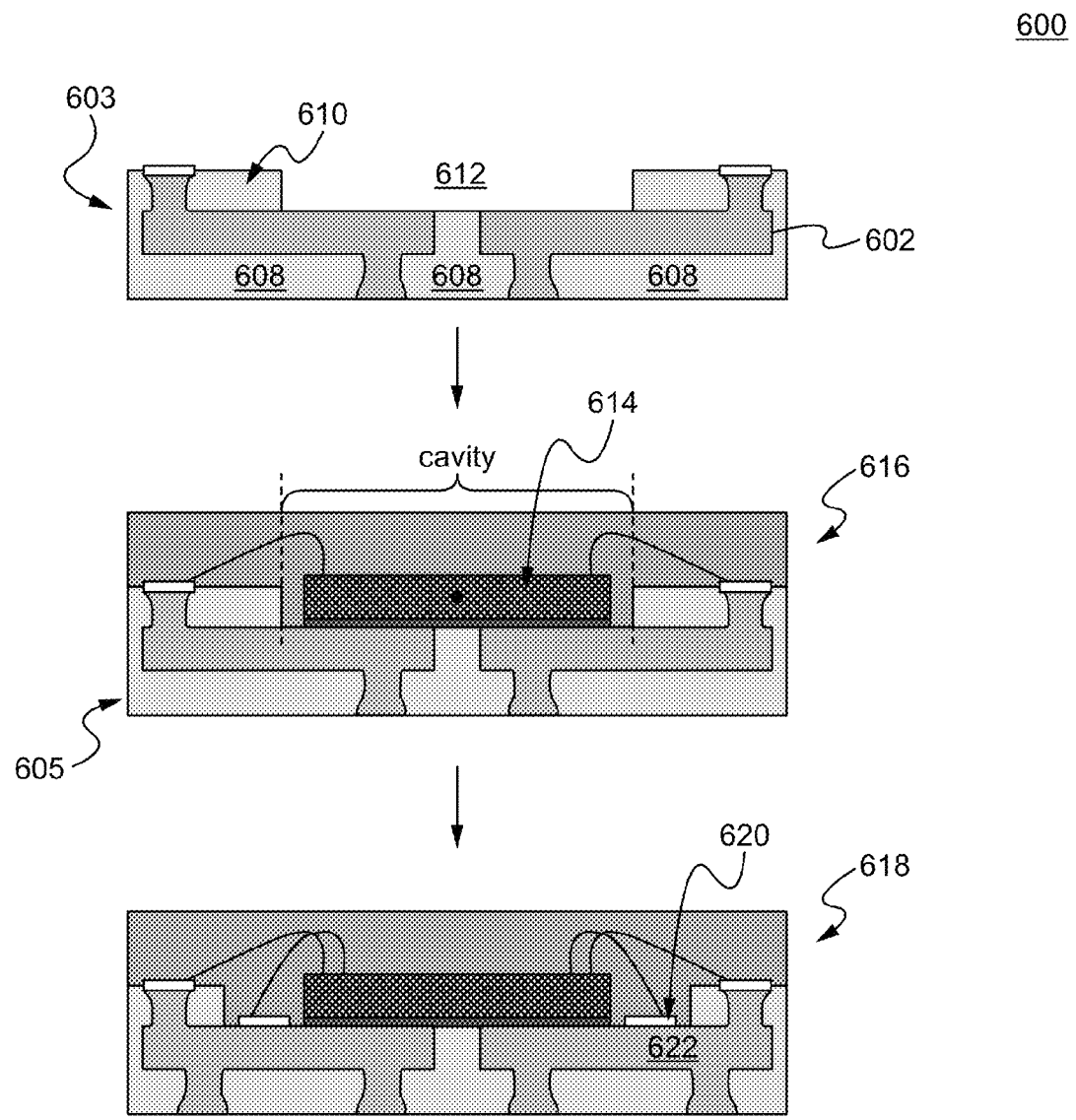
FIG. 6 illustrates a reserved die cavity premolded structure manufacturing method 600 in accordance with some embodiments of the present invention.
Figure 7A:
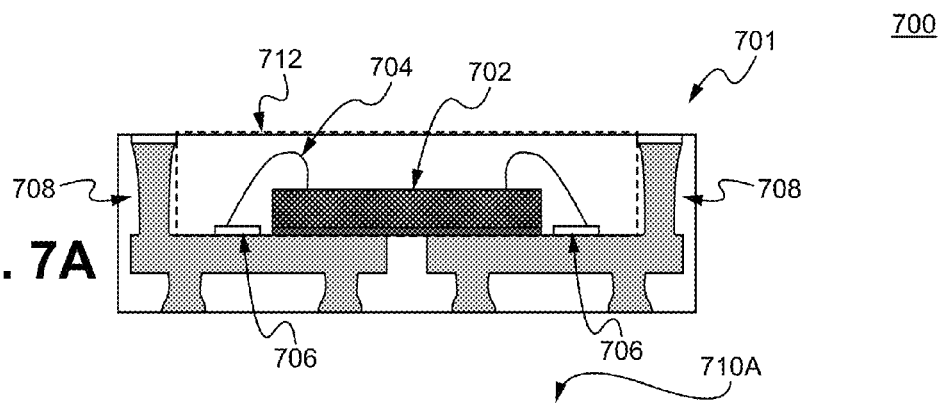
FIGS. 7A-7F are cross sectional views illustrating die embedded structures 700 in accordance with some embodiments of the present invention.
Figure 7B:
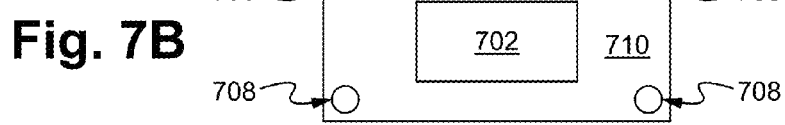
Figure 7C:
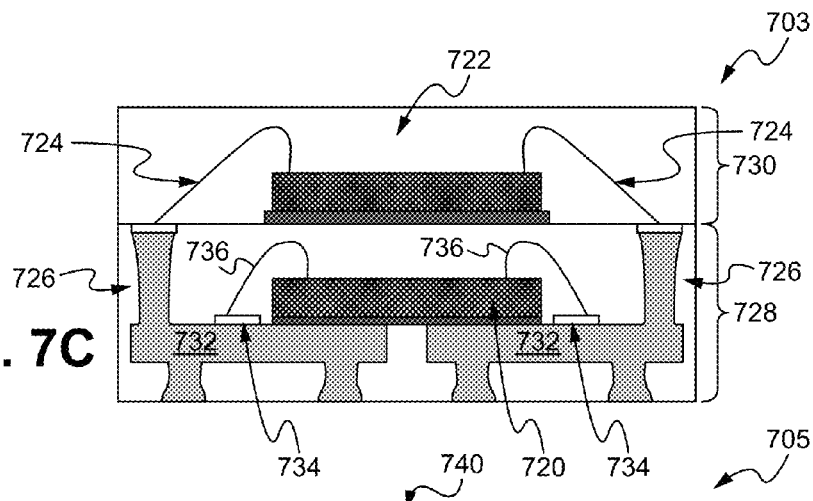
Figure 7D:
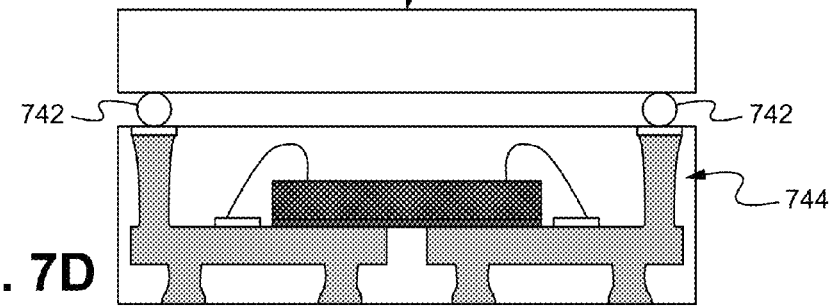
Figure 7E:
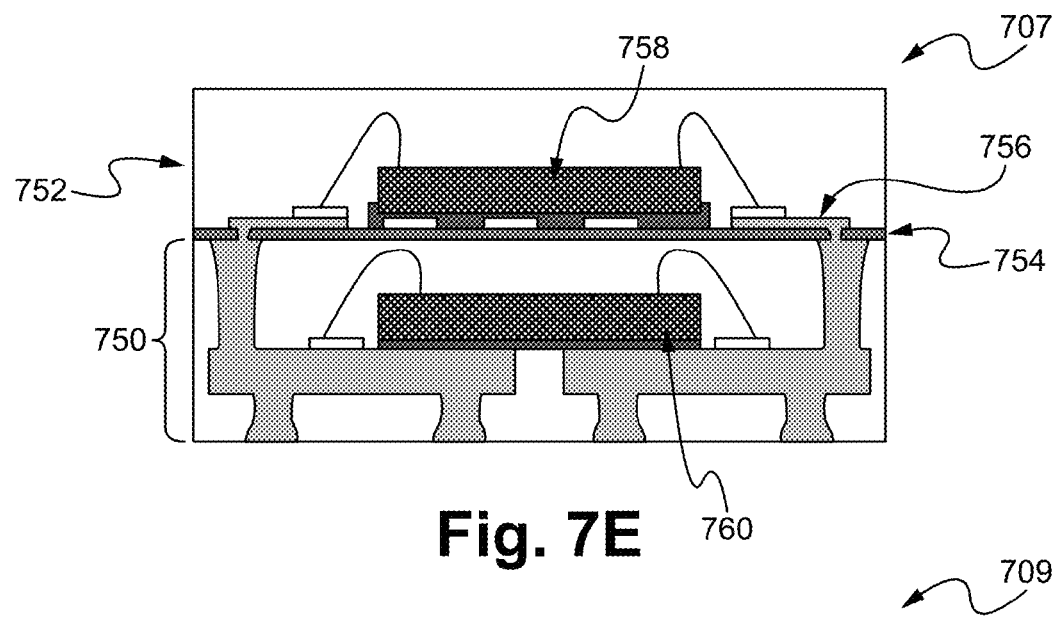
Figure 7F:
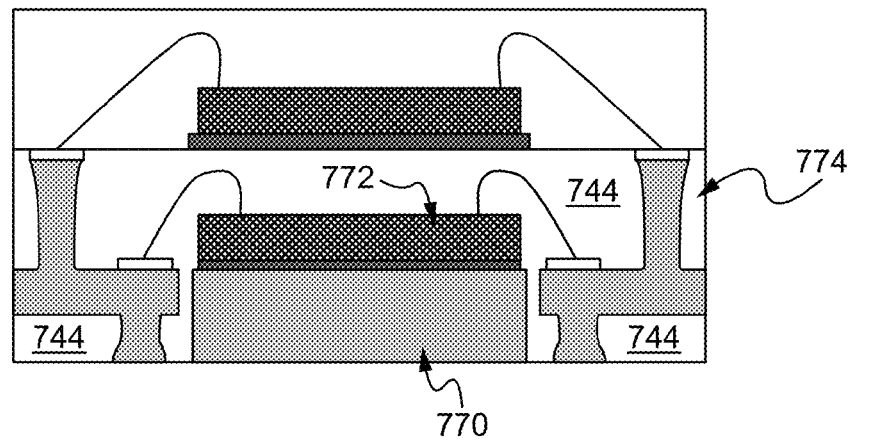

FIG. 6 illustrates a reserved die cavity premolded structure manufacturing method 600 in accordance with some embodiments of the present invention.

At a Step 603, a first protective layer 610 is applied on top surface of the leadframe 602 leaving a reserved cavity 612. The cavity 612 can be reserved for coupling a die 614. A second protective layer 608 is applied on the bottom of the leadframe 602.

At a Step 605, a die 614 is coupled with the leadframe 602 and is attached inside the cavity 612 with wires bonded with the wire bonding pads. A molding material 616 is molded over the cavity and encloses the entire top surface of the leadframe 602 with the die 614.

As shown in view 618, wire bonding pads 620 can be coupled with the traces 622 in some embodiments forming a double layered wire bonding pad structure. In this case, a portion of the traces or a portion body of the leadframe 602 are exposed for coupling with the wire bonding pads. A person of ordinary skill in the art appreciates that any numbers of wire bonding pads can be coupled with the leadframe 602.

FIGS. 7A-7F are cross sectional views illustrating die embedded structures 700 in accordance with some embodiments of the present invention. The die embedded structures provides advantageous features. The structure 701 (FIG. 7A) comprises one or more pillars 708 forming a protective structure protecting the die 702, wires 704, and the wire bonding pads 706 to prevent damages causing by outside forces. In the example having two or more pillars 708 as shown, the pillars 708 are formed around the die 702 forming a cavity 712 having the die 702, wires 704, and wire bonding pads 706 therewithin.

The view 701A (FIG. 7B) is top view of the structure 701, which shows that four pillars 708 are located at four corners surrounding the die 702. Other locations are also possible. A person of ordinary skill in the art appreciates that any number of pillars are within the scope of the present invention. In some embodiments, the pillars are in a continuous structure. For example, the pillars can be a wall structures or a bowl structure surrounding the die 702.

The structure 703 (FIG. 7C) shows an exemplary double die in a double layered structure. A first layer 728 with a die enclosed in a leadframe couples with a second layer 730. The coupling of a first die 720 and the second die 722 is done by coupling the second die 722 via the wire bonds 724 in the second layer 730 with the wire bonding pads and pillars 726 through traces 732, wire bonding pads 734, and wires 736 with the first die 720 in the first layer 728.

The structure 705 (FIG. 7D) shows an example of a tested package 705 on the die embedded leadframe structure. The tested package 705 electrically couples with the die embedded structure 744. An electrical signal is received at the tested package 705 sending from the die embedded structure 744 through the solder bump 742. In some embodiments, a complete packages, such as BGA (ball grid array), QFN (Quad Flat No-leads package), WLCSP (wafer-level chip-scale package) can be electrically and functionally tested prior attaching to a molded leadframe. A person of ordinary skill in the art appreciates that a flip chip can be used to replace the IC/die disclosed throughout the present specification.

The structure 707 (FIG. 7E) shows an exemplary double die in a separated double layered structure. The bottom layer of a leadframe structure 750 can be made using the method 600 of FIG. 6. The leadframe structure 750 can be separated by an insulation layer 754 with the second electronic layer 752. The die 758 electronically couples with the die 760 via routing traces 756. A portion of the routing traces 756 are in the insulation layer 754 forming conducting paths. In some embodiments, the insulation layer 754 serves as an adhesion for coupling the leadframe structure 750 and the second electronic layer 752.

The structure 709 (FIG. 7F) shows an exemplary die attach paddle (DAP) 770 included in the leadframe. The bottom surface of the DAP is exposed from the bottom surface of the protective layer 774. In some embodiments, one or more terminals are formed at the DAP using a pressure cutting/pressing process or an etching process described above.

Figure 8:
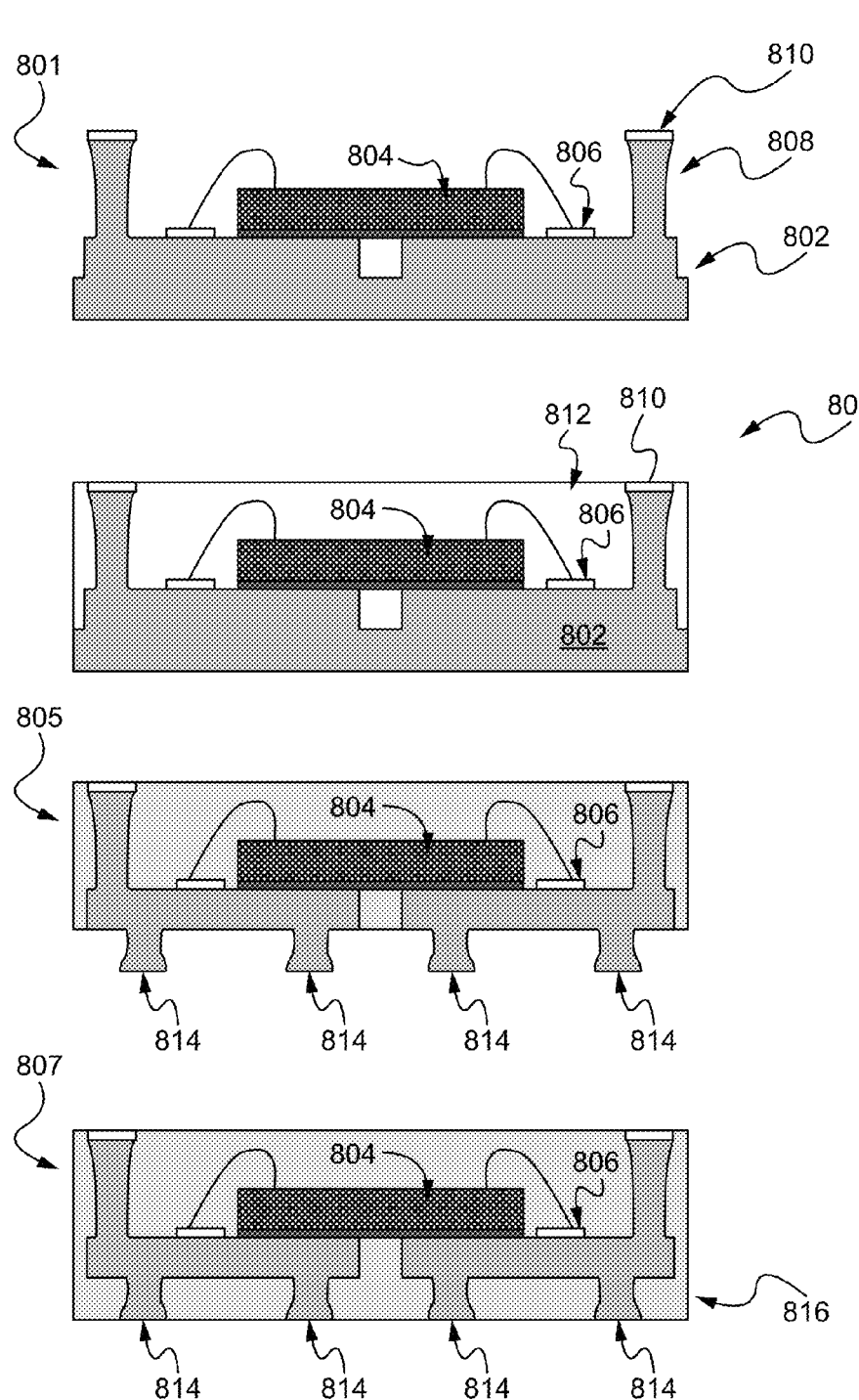
FIG. 8 illustrate another leadframe with embedded die making method 800 in accordance with some embodiments of the present invention.

FIG. 8 illustrates another leadframe with embedded die making method 800 in accordance with some embodiments of the present invention. At a Step 801, a shaped leadframe 802 is formed having one or more pillars 808 having a height greater than the thickness of a IC chip/die 804 embedded. A first set of wire bonding pads 810 are on top of the pillars 808. The leadframe 802 can be formed using the Steps 401-405 of the FIG. 4 above. A die 804 is attached and bonded with the second wire bonding pads 806.

At a Step 803, a first protective layer 812 is applied on the leadframe 802 covering/encapsulating the die 804, wires, and the second wire bonding pads 806. The first wire bonding pads 810 are exposed for further uses, such as connecting with another electronic components (e.g., another IC chip). The first protective layer 812 can be a molded underfill material.

At a Step 805, an etching process is performed. The bottom surface of the leadframe 802 is etched forming one or more terminals 814. The terminals of the present invention can be in any shape, such as a rounded pillar structure. At a Step 807, a second protective layer 816 is applied on the leadframe 802 enclosing the entire side/substantially the entire side of the one or more terminals 814.

Figure 9:
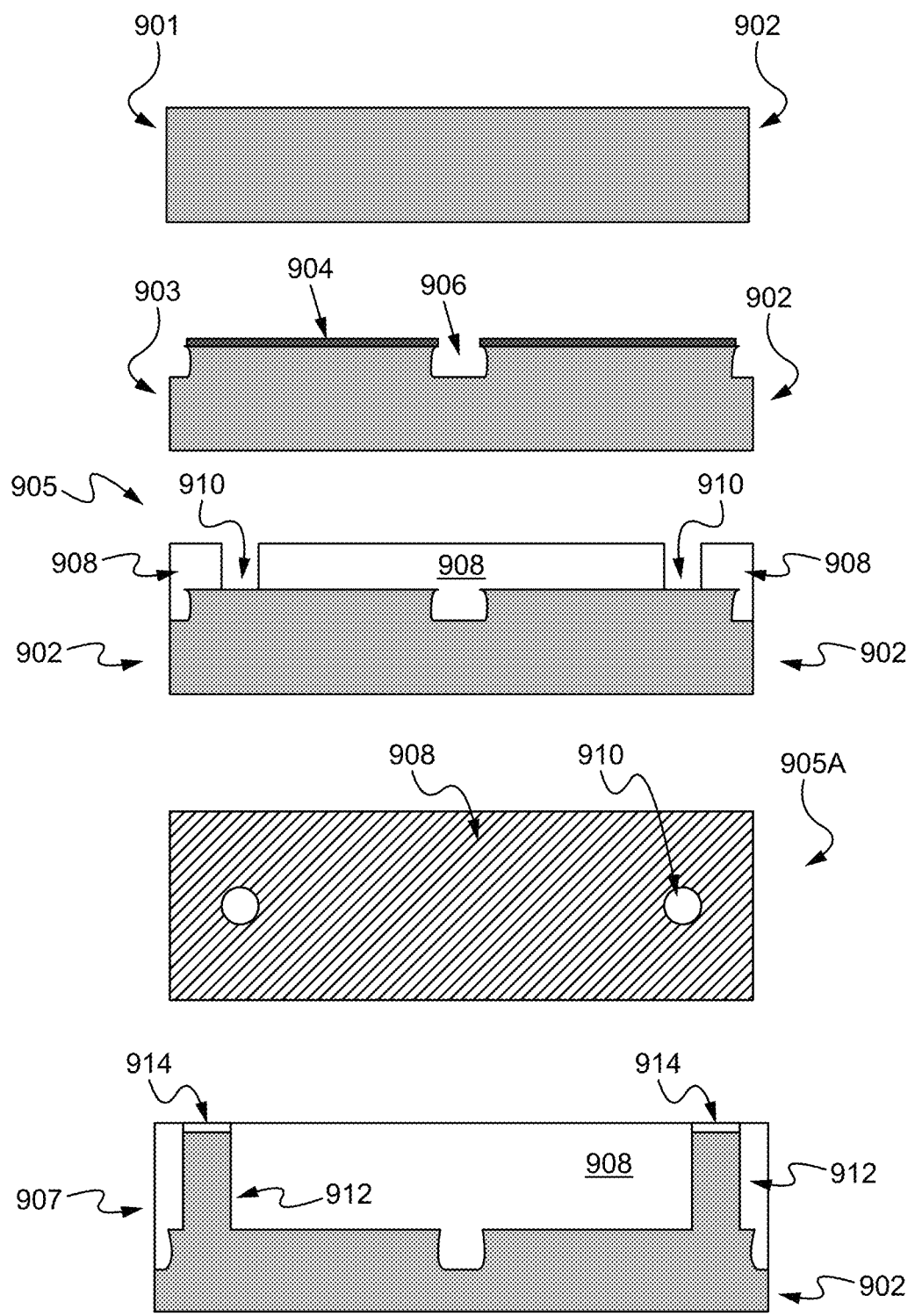
FIG. 9 illustrate a pillar forming method 900 in accordance with some embodiments of the present invention.

FIG. 9 illustrates a pillar forming method 900 in accordance with some embodiments of the present invention. At a Step 901, a metallic foil 902 is provided. In some other embodiments, an entire body or a predetermined portion of the metallic foil 902 comprises copper, copper alloy, iron-nickel alloy, or a combination thereof. In some embodiments, the thickness of the metallic foil ranges from 10-300 micron. For example, the thickness of the metallic foil is 150 micron.

At a Step 903, a first mask 904 is applied over a top surface of the foil 902. In some embodiments, the first mask 904 is a mechanical mask. In some other embodiments, the first mask 904 is a photo-sensitive mask. The area that are not covered by the first mask 904 is removed/etched forming a first etched area 906.

At a Step 905, a plating mask 908 is applied on the etched leadframe 902. One or more openings 910 are formed (e.g., drilled)/reserved on the plating mask (a plating layer). The locations of the openings corresponds to the locations where pillars will be formed subsequently. The view 905A is a top view of the etched leadframe 902 with the applied plating mask 908.

At a Step 907, one or more pillars 912 and wire bond pads 914 are formed by plating, such as an electronic plating process. The pillars 912 are formed on the location of the opening 910. The wire bond pads 914 are formed on top of the pillars 912. The leadframe 902 can function as a conductor providing an electrical conductive path/plating current path during the plating processes. The method 900 is able to manufacture pillars with any predetermined height, which can be determined by the thickness of the plating mask 908. For example, the pillar 912 can be higher, shorter, or equal to the thickness of die attached to the leadframe. Any predetermined surface areas of the pillars are within the scope of the present invention, such as 1 mm or greater than 1 nm.

Figure 10:
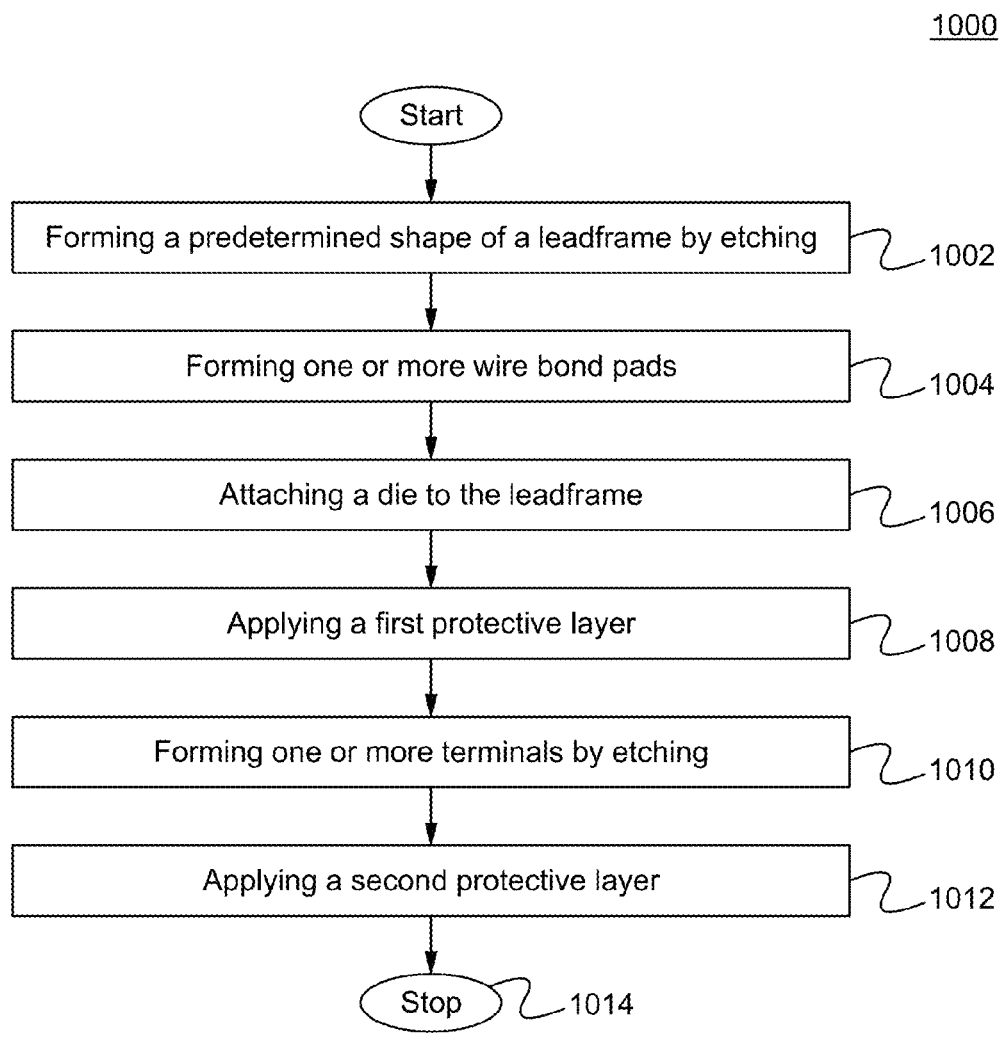
FIG. 10 is a flow chart illustrating a semiconductor package manufacturing method 1000 in accordance with some embodiments of the present invention.

FIG. 10 is a flow chart illustrating a semiconductor package manufacturing method 1000 in accordance with some embodiments of the present invention. At a Step 1002, a predetermined shape of leadframe is formed by using an etching process. At a Step 1004, one or more wire bond pads are formed. At a Step 1006, a die is attached to the leadframe. In some embodiments, the leadframe comprises a cavity configured for fitting the die, such as snug-fit. At a Step 1008, a first protective layer is applied on the top surface of the leadframe. At a Step 1010, one or more terminals are formed by etching on the bottom surface of the leadframe. At a Step 1012, a second protective layer is applied on the bottom surface of the leadframe. The method 1000 can stop at a Step 1014. A person of ordinary skill in the art appreciates that a flip chip can be used to replace the IC/die disclosed throughout the present specification. The steps described in the above methods/processes can be performed in any sequences/orders. For example, the bottom side terminals can be formed before the etching of the top side features of the leadframe.

To utilize the semiconductor package, the leadframe based structure is applied in any manner appropriate such as incorporated in a BGA, QFN, and WLCSP packages. The leadframe based structure is used in the same manner that other electronic components are used, for example, making electronic and/signal coupling among IC chips. In production, the leadframe based structure is able to be generated using the implementations described.

In operation, the leadframe based structure serves as the base of the semiconductor package, which generates significant social, economic and environmental benefits. By having the leadframe based structure, the dies and wires are better shielded and protected.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A semiconductor package comprising:
   a) a first pillar structure on and perpendicular to the first end of a leadframe;
   b) a second pillar structure on and perpendicular to the second end of the lead frame;
   c) a cavity between the first and the second pillars; and
   d) a die physically coupling with the leadframe within the cavity.

2. The semiconductor package of claim 1, wherein the pillars are taller than the die.

3. The semiconductor package of claim 1, further comprising a first molding material encapsulating a side wall of the first pillar, a side wall the second pillars, and the die.

4. The semiconductor package of claim 1, wherein the first pillar couples with a first wire bonding pad.

5. The semiconductor package of claim 4, wherein the leadframe couples with a second wire bonding pad.

6. A semiconductor package comprising:
   a) a first wire bond pad having a first top surface on the first end of a leadframe;
   b) a second wire bond pad having a second top surface on the second end of the lead frame, wherein the first wire bond pad and the second wire bond pad are on and perpendicular to the lead frame;
   c) a cavity between the first and the second wire bond pads; and
   d) a die having a bottom surface coupling with the leadframe within the cavity, wherein the first top surface of the first wire bond is higher than the bottom surface of the die.

7. The semiconductor package of claim 6, wherein the first wire bond couples with a plating layer.

8. The semiconductor package of claim 6, further comprises one or more terminals.

9. The semiconductor package of claim 8, wherein the one or more terminals are pointing to a direction opposite to a direction that the first wire bond pad is pointing.

10. The semiconductor package of claim 8, further comprises a protective layer.

11. The semiconductor package of claim 8, wherein the protective layer covers an entire side area of the one or more terminals.

12. The semiconductor package of claim 8, wherein the one or more terminals is formed by using a molded underfill material.

13. The semiconductor package of claim 8, wherein the one or more terminals comprises an exposed end surface.

14. A semiconductor package comprising:
   a) a metallic foil etched to have a shape containing traces, terminals, and bonding pads, wherein the bonding pads vertically and perpendicularly protruding from the body of the traces;
   b) a recess between two of the bonding pads; and
   c) a portion of a die coupling with the metallic foil in the recess.

15. The semiconductor package of claim 14, wherein the bonding pads are coated with a plating layer.

16. The semiconductor package of claim 14, wherein the terminals comprises side walls surrounded by a protective layer.

17. The semiconductor package of claim 14, further comprising a space between the die and the metallic foil, wherein the space is filled with a deformable material.

18. The semiconductor package of claim 17, wherein the deformable material comprises a deformable adhesive.

19. The semiconductor package of claim 14, wherein the metallic foil has a thickness in a range between 10-300 micrometers.

* * * * *